(12) United States Patent
Chodem et al.

(10) Patent No.: US 12,229,416 B2
(45) Date of Patent: Feb. 18, 2025

(54) HOLD-UP CAPACITOR FAILURE HANDLING IN DATA STORAGE DEVICES

(71) Applicant: Western Digital Technologies, Inc., San Jose, CA (US)

(72) Inventors: Nagi Reddy Chodem, Bangalore (IN); Sergey Anatolievich Gorobets, Edinburgh (GB); Evangelos Vazaios, Edinburgh (GB)

(73) Assignee: Sandisk Technologies, Inc., Milpitas, CA (US)

( * ) Notice: Subject to any disclaimer, the term of this patent is extended or adjusted under 35 U.S.C. 154(b) by 91 days.

(21) Appl. No.: 18/348,316

(22) Filed: Jul. 6, 2023

(65) Prior Publication Data

US 2024/0111434 A1 Apr. 4, 2024

Related U.S. Application Data

(60) Provisional application No. 63/413,131, filed on Oct. 4, 2022.

(51) Int. Cl.
*G06F 3/06* (2006.01)
*G06F 11/07* (2006.01)
*G06F 11/20* (2006.01)

(52) U.S. Cl.
CPC .......... *G06F 3/0619* (2013.01); *G06F 3/0656* (2013.01); *G06F 3/0679* (2013.01); *G06F 11/0793* (2013.01); *G06F 11/2015* (2013.01); *G06F 11/2017* (2013.01); *G06F 2201/85* (2013.01)

(58) Field of Classification Search
CPC ...... G06F 1/30; G06F 3/0656; G06F 11/2017; G06F 11/0793; G06F 11/2015; G06F 11/2221; G11C 5/141; G11C 16/30
See application file for complete search history.

(56) References Cited

U.S. PATENT DOCUMENTS

| 12,007,821 B2 * | 6/2024 | Lu .............................. G06F 1/30 |
| 2008/0189452 A1 * | 8/2008 | Merry .................. G11B 19/044 710/56 |
| 2009/0248756 A1 * | 10/2009 | Akidau ................. G06F 11/004 707/999.203 |
| 2010/0202240 A1 * | 8/2010 | Moshayedi ............ G11C 16/30 365/228 |
| 2014/0103955 A1 | 4/2014 | Avritch et al. |
| 2015/0193299 A1 | 7/2015 | Hyun et al. |

(Continued)

FOREIGN PATENT DOCUMENTS

WO 2020242750 A1 12/2020

*Primary Examiner* — Gabriel Chu
(74) *Attorney, Agent, or Firm* — Morgan, Lewis & Bockius LLP

(57) ABSTRACT

A data storage device includes a plurality of hold-up capacitors configured to provide back-up power for a non-volatile memory, a controller, and a write cache. The controller is configured to detect one or more failed hold-up capacitors of the plurality of hold-up capacitors; and in response to detecting the one or more failed hold-up capacitors: perform one or more quiesce operations and determine a count of the one or more failed hold-up capacitors. Based on the count of the one or more failed hold-up capacitors, the controller is configured to reallocate the write buffers of the write cache for use in one or more subsequent write operations.

20 Claims, 8 Drawing Sheets

(56) References Cited

U.S. PATENT DOCUMENTS

| | | | |
|---|---|---|---|
| 2015/0268709 A1* | 9/2015 | Morning-Smith | H02J 7/345 307/64 |
| 2018/0059761 A1* | 3/2018 | An | G06F 13/4068 |
| 2020/0005874 A1 | 1/2020 | Shappir et al. | |
| 2021/0034128 A1 | 2/2021 | Suljic et al. | |
| 2021/0036540 A1* | 2/2021 | Suljic | G06F 3/0625 |
| 2021/0089225 A1* | 3/2021 | Boyd | G06F 3/0679 |
| 2021/0089447 A1* | 3/2021 | Jin | G06F 1/263 |
| 2021/0349782 A1* | 11/2021 | Ki | G06F 3/0634 |
| 2022/0035552 A1* | 2/2022 | Jain | G06F 3/0619 |
| 2023/0418479 A1* | 12/2023 | Chodem | G11C 29/021 |

\* cited by examiner

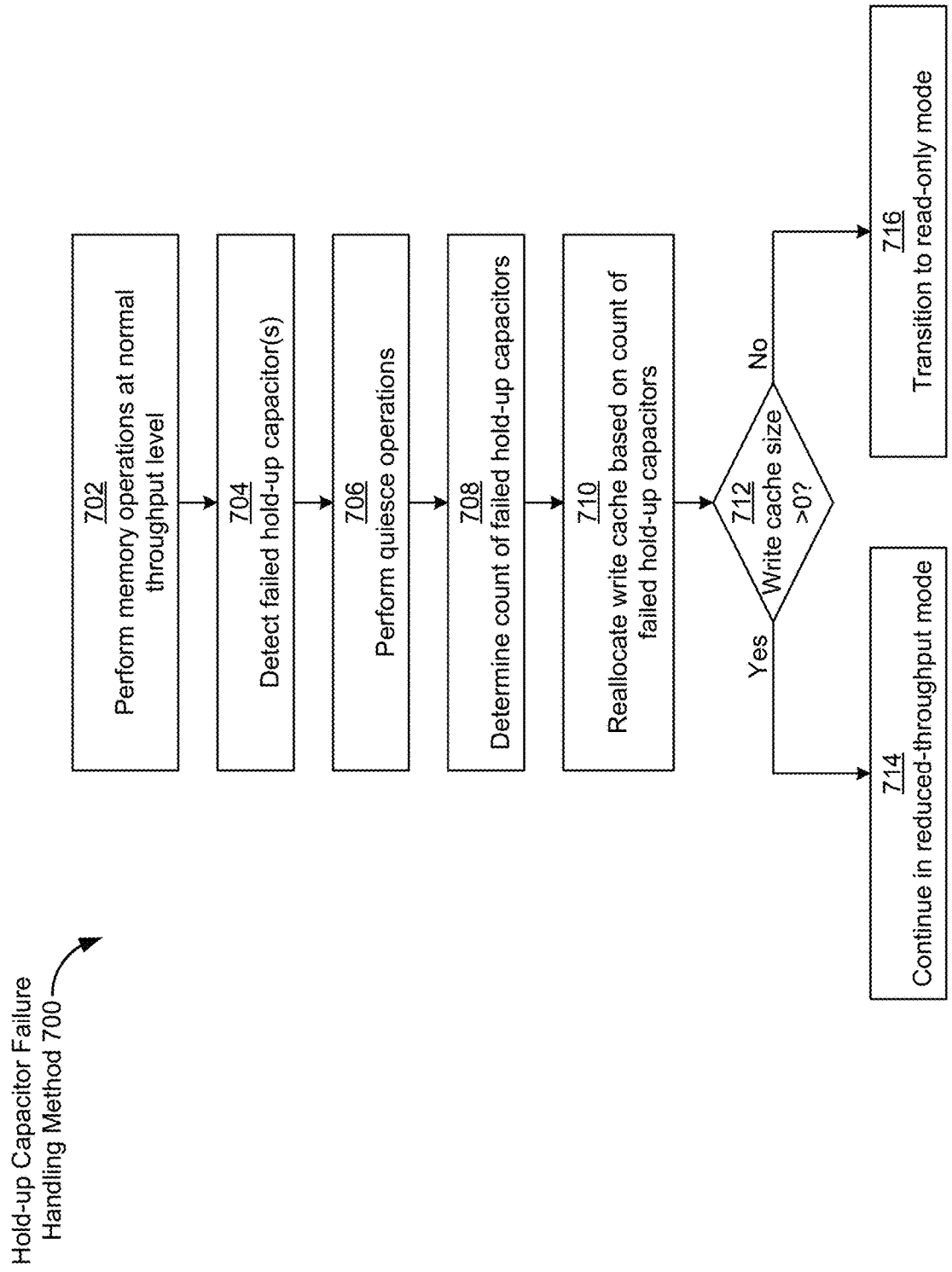

HOLD-UP CAPACITOR FAILURE HANDLING IN DATA STORAGE DEVICES

CROSS-REFERENCE TO RELATED APPLICATION

This application claims the benefit of U.S. Provisional Application No. 63/413,131, filed on Oct. 4, 2022, the entirety of which is incorporated herein by reference for all purposes.

BACKGROUND

Data storage devices enable users to store and retrieve data. Examples of data storage devices include non-volatile memory devices. A non-volatile memory generally retains data after a power cycle. An example of a non-volatile memory is a flash memory, which may include one or more arrays of not-and (NAND) cells on one or more dies. Flash memory may be found in solid-state drives (SSDs), secure digital (SD) cards, and the like.

Data storage devices, such as SSDs, may include a bank of hold-up capacitors to protect against unexpected power loss so as to secure user data. If one or more hold-up capacitors fail during the life of the drive, the drive may not be able to properly power down. This could cause the drive to lose functionality, and could even cause a scenario in which a user can no longer access the data stored on the drive.

Some conventional data storage devices may implement various self-protective measures upon detection of a failed hold-up capacitor in order to prevent the loss of user data stored on the drive. While these measures may have the benefit of preventing data loss, they often come at the cost of severely restricted drive performance and/or functionality. Such restrictions, which could be as severe as preventing subsequent writes to the drive, are typically substantial and irreversible.

SUMMARY

Based on the discussion above as well as other problems and disadvantages of the related art, there is a need for a system that can handle hold-up capacitor failures in a data storage device in a more elegant way that not only prevents data loss, but also retains more of the performance and functionality of the drive. A data storage device implementing such a system could continue to be usable after one or more hold-up capacitors fail. In addition, such a data storage device could exhibit improved post-capacitor-failure write performance when compared to that of conventional data storage devices.

According to one or more aspects of the hold-up capacitor failure handling schemes described herein, upon detection of a failed hold-up capacitor, a data storage device controller isolates and counts the number of failed hold-up capacitors. Based on the number of failed hold-up capacitors, the controller reallocates a write cache of the data storage device before performing subsequent write operations.

In some implementations, the reallocating may include reducing the size of the write cache used in the performance of subsequent write operations. The portion of the write cache that remains after the hold-up capacitor failure may continue to be used for low-latency cached write operations, thereby optimizing the write performance of the data storage device while maintaining dependability after a hold-up capacitor failure. The size of this reduced portion may depend on the number of failed hold-up capacitors.

In some implementations, in addition to or as an alternative to reducing the size of the write cache used in the performance of subsequent write operations, the reallocating may include dividing the write cache into portions that handle subsequent write operations differently. For example, a first portion may continue to perform low-latency cached write operations while a second portion may perform less efficient but more dependable write-through write operations, thereby optimizing the write performance of the data storage device while maintaining dependability after a hold-up capacitor failure. The size of each portion may depend on the number of failed hold-up capacitors.

In one or more aspects, the aforementioned write cache reallocation schemes optimize the write performance of the data storage device by allowing more of the write cache to continue to be useful after a hold-up capacitor failure. Further, the aforementioned write cache reallocation schemes maintain dependability of the data storage device by preventing data loss that could otherwise occur after subsequent power-down events.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure. Like components are labeled with identical element numbers for ease of understanding.

FIG. 7 is a flowchart of an example of a hold-up capacitor failure handling method in accordance with some implementations.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The present description relates in general to data storage systems and methods, and more particularly to, for example, without limitation, hold-up capacitor failure handling in data storage devices.

One or more implementations of the subject technology provide several performance benefits that improve the functionality of a computer. By reallocating the write cache based on a number of failed hold-up capacitors using the schemes described herein, user data can be secured while optimizing write performance of the data storage device. In turn, a host computer coupled to the data storage device also receives the benefits of the data storage device's improved performance and security.

Figure 1:
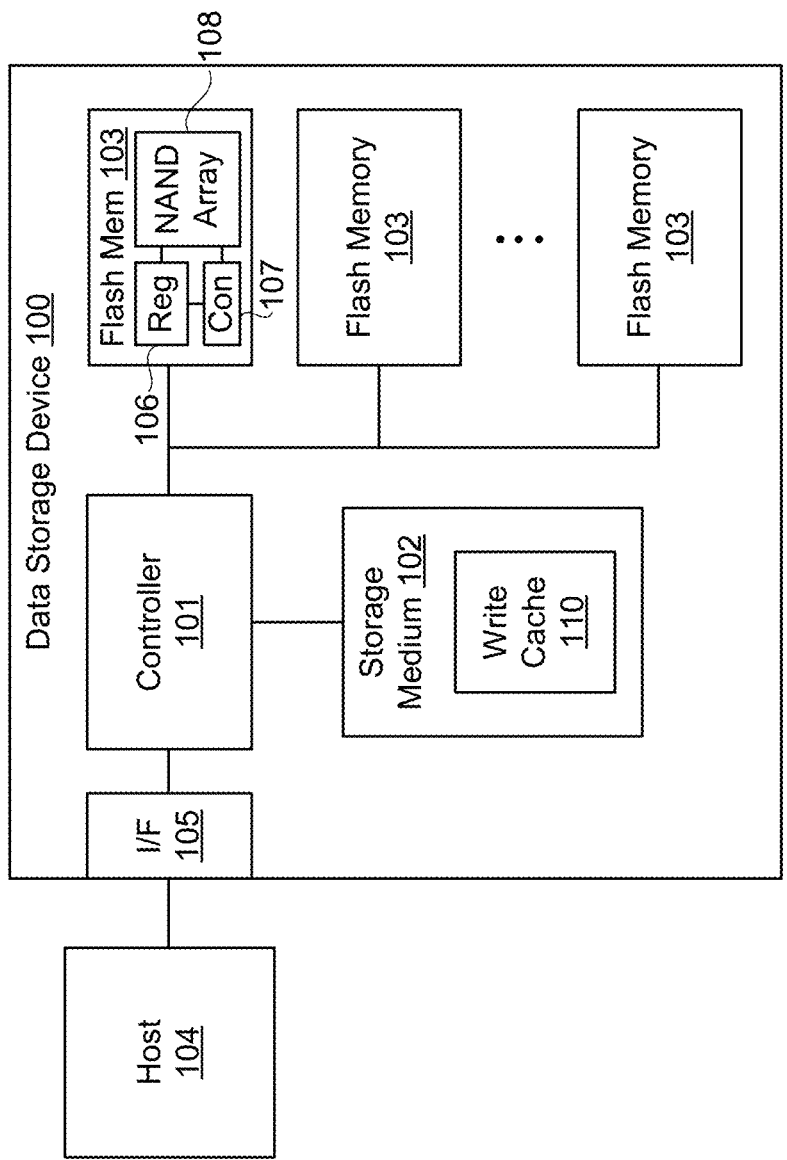
FIG. 1 is a block diagram illustrating components of an example data storage system in accordance with some implementations.

FIG. 1 is a block diagram illustrating components of an example data storage system, according to aspects of the subject technology. A data storage system may be sometimes referred to as a system, a data storage device, a storage device, a solid-state drive, a drive, or a device. As depicted in FIG. 1, In some implementations, a data storage device 100 (e.g., a solid-state drive (SSD)) includes a data storage controller 101, a storage medium 102, and a flash memory array including one or more flash memory 103. The data storage controller 101 may be sometimes referred to as a controller. A controller may include one or more controllers. The controller 101 may use the storage medium 102 for temporary storage of data and information used to manage the data storage device 100. The controller 101 may include several internal components (not shown), such as a read-only memory, other types of memory, a flash component interface (e.g., a multiplexer to manage instruction and data transport along a serial connection to the flash memory 103), an input/output (I/O) interface, error correction circuitry, and the like. In some implementations, some or all of these elements of the controller 101 may be integrated into a single chip. In other aspects, these elements may be separated on their own printed circuit board (PCB).

In some implementations, aspects of the subject disclosure may be implemented in the data storage device 100. For example, aspects of the subject disclosure may be integrated with the function of the data storage controller 101 or may be implemented as separate components for use in conjunction with the data storage controller 101.

The controller 101 may also include one or more processors that may be configured to execute code or instructions to perform the operations and functionality described herein, manage request flow and address mappings, and to perform calculations and generate commands. The one or more processors of the controller 101 may be configured to monitor and/or control the operation of the components in the data storage controller 101. A processor may be a microprocessor, a microcontroller, or a digital signal processor (DSP). A processor may be implemented using, for example, an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on read-only-memory (ROM) within the controller 101 and/or its processor. One or more sequences of instructions may be software stored and read from the storage medium 102, the flash memory 103, or received from a host device 104 (e.g., via a host interface 105). ROM, the storage medium 102, the flash memory 103, represent examples of machine or computer readable media on which instructions/code executable by the controller 101 and/or its processor(s) may be stored. Machine or computer readable media may generally refer to any medium or media used to provide instructions to the controller 101 and/or its processor, including volatile media, such as dynamic memory used for the storage media 102 or for buffers within the controller 101, and non-volatile media, such as electronic media, optical media, and magnetic media. A medium or media may be a non-transitory medium or media.

In some implementations, the controller 101 may be configured to store data received from the host device 104 in the flash memory 103 in response to a write command from the host device 104. The controller 101 is further configured to read data stored in the flash memory 103 and to transfer the read data to the host device 104 in response to a read command from the host device 104. A host device 104 may be sometimes referred to as a host, a host system, or a host computer.

The host device 104 represents any device configured to be coupled to the data storage system 100 and to store data in the data storage system 100. The host device 104 may be a computing system such as a personal computer, a server, a workstation, a laptop computer, a personal digital assistant (PDA), a smart phone, or the like. Alternatively, the host device 104 may be an electronic device such as a digital camera, a digital audio player, a digital video recorder, or the like.

In some implementations, the storage medium 102 represents volatile memory used to temporarily store data and information used to manage the data storage system 100. According to aspects of the subject technology, the storage medium 102 is random access memory (RAM), such as double data rate (DDR) RAM. Other types of RAM may be also used to implement the storage medium 102. The storage medium 102 may be implemented using a single RAM module or multiple RAM modules. While the storage medium 102 is depicted as being distinct from the controller 101, those skilled in the art will recognize that the storage medium 102 may be incorporated into the controller 101 without departing from the scope of the subject technology. Alternatively, the storage medium 102 may be a non-volatile memory, such as a magnetic disk, flash memory, peripheral SSD, and the like.

In some implementations, the storage medium 102 includes a write cache 110, which may be configured to temporarily store data corresponding to write commands received from the host 104, for the purpose of being passed to one or more flash memories 103 for storage. By storing the data first in the write cache 110, write commands can be met with improved performance. The write cache 110 may include a plurality of buffers for storing the data to be written. The plurality of buffers may be referred to as a buffer pool. Likewise, the write cache 110 may be referred to as a buffer pool. In some implementations, the write cache 110 may be combined or otherwise include a read cache; as such, cache 110 may sometimes be referred to as a read/ write cache. In one or more aspects of this disclosure, which is focused on optimizing write performance, cache 110 may be referred to as a write cache. The write cache 110 may be a non-volatile write cache, including non-volatile memory such as a magnetic disk, flash memory, peripheral SSD, and the like. In some implementations, the write cache 110 (or the storage medium 102) may be included in the controller 101. In some implementations, a data storage device (e.g., 100) including a controller and a write cache may represent a data storage device including a controller and a write cache (which is outside the controller), or may represent a data storage device including a controller and a write cache (which is within the controller).

As further depicted in FIG. 1, the data storage system 100 may also include the host interface 105. The host interface 105 may be configured to be operably coupled (e.g., by wired or wireless connection) to the host device 104, to receive data from the host device 104 and to send data to the host device 104. The host interface 105 may include electrical and physical connections, or a wireless connection, for operably coupling the host device 104 to the controller 101 (e.g., via the I/O interface of the controller 101). The host interface 105 may be configured to communicate data, addresses, and control signals between the host device 104 and the controller 101. Alternatively, the I/O interface of the controller 101 may include and/or be combined with the host interface 105. The host interface 105 may be configured to implement a standard interface, such as a small computer system interface (SCSI), a serial-attached SCSI (SAS), a fiber channel interface, a peripheral component interconnect express (PCIe), a serial advanced technology attachment (SATA), a universal serial bus (USB), a nonvolatile memory express (NVMe), or the like. The host interface 105 may be configured to implement only one interface. Alternatively, the host interface 105 (and/or the I/O interface of controller 101) may be configured to implement multiple interfaces, which may be individually selectable using a configuration parameter selected by a user or programmed at the time of assembly. The host interface 105 may include one or more buffers for buffering transmissions between the host device 104 and the controller 101.

The flash memory 103 may represent a non-volatile memory device for storing data. According to aspects of the subject technology, the flash memory 103 includes, for example, a not-and (NAND) flash memory. The flash memory 103 may include a single flash memory device or chip, or (as depicted in FIG. 1) may include multiple flash memory devices or chips arranged in multiple channels. The flash memory 103 is not limited to any particular capacity or configuration. For example, the number of physical blocks, the number of physical pages per physical block, the number of sectors per physical page, and the size of the sectors may vary within the scope of the subject technology.

The flash memory may have a standard interface specification so that chips from multiple manufacturers can be used interchangeably (at least to a large degree). The interface hides the inner working of the flash and returns only internally detected bit values for data. In aspects, the interface of the flash memory 103 is used to access one or more internal registers 106 and an internal flash controller 107 for communication by external devices (e.g., the controller 101). In some implementations, the registers 106 may include address, command, and/or data registers, which internally retrieve and output the necessary data to and from a NAND memory cell array 108. A NAND memory cell array 108 may be sometimes referred to as a NAND array, a memory array, or a NAND. For example, a data register may include data to be stored in the memory array 108, or data after a fetch from the memory array 108 and may also be used for temporary data storage and/or act like a buffer. An address register may store the memory address from which data will be fetched to the host device 104 or the address to which data will be sent and stored. In some implementations, a command register is included to control parity, interrupt control, and the like. In some implementations, the internal flash controller 107 is accessible via a control register to control the general behavior of the flash memory 103. The internal flash controller 107 and/or the control register may control the number of stop bits, word length, receiver clock source, and may also control switching the addressing mode, paging control, coprocessor control, and the like.

In some implementations, the registers 106 may also include a test register. The test register may be accessed by specific addresses and/or data combinations provided at the interface of flash memory 103 (e.g., by specialized software provided by the manufacturer to perform various tests on the internal components of the flash memory). In further aspects, the test register may be used to access and/or modify other internal registers, for example the command and/or control registers. In some implementations, test modes accessible via the test register may be used to input or modify certain programming conditions of the flash memory 103 (e.g., read levels) to dynamically vary how data is read from the memory cells of the memory arrays 108. The registers 106 may also include one or more data latches coupled to the flash memory 103.

It should be understood that in all cases data may not always be the result of a command received from the host 104 and/or returned to the host 104. In some implementations, the controller 101 may be configured to execute a read operation independent of the host 104 (e.g., to verify read levels or a bit error rate (BER)). The predicate words "configured to," "operable to," and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Figure 2:
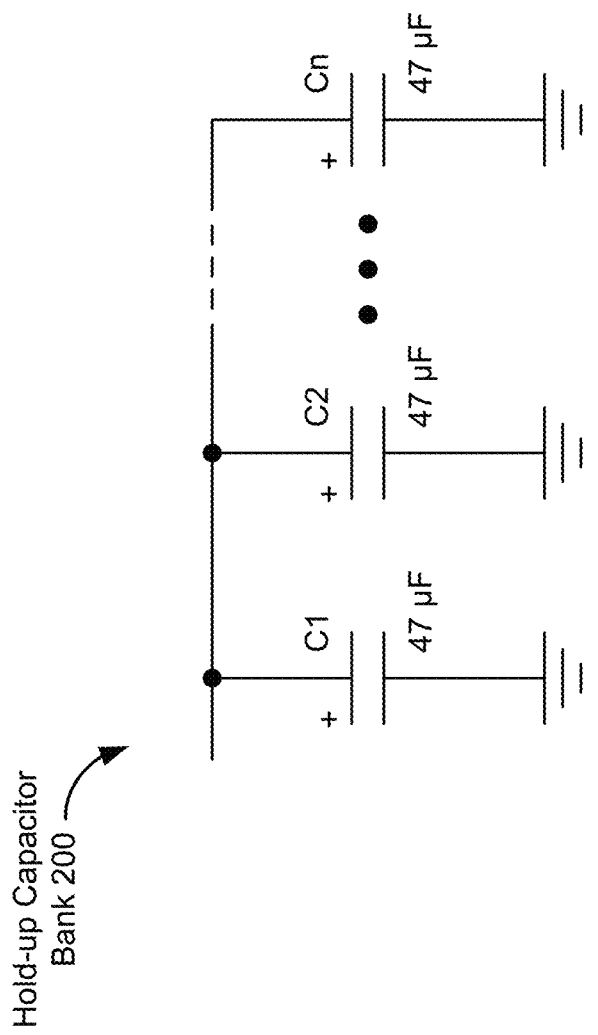
FIG. 2 is a circuit diagram of an example hold-up capacitor bank for providing power loss protection in a data storage device in accordance with some implementations.

FIG. 2 is a circuit diagram of an example hold-up capacitor bank 200 configured to provide power loss protection in a data storage device (e.g., an SSD) in accordance with some implementations. In this example, the capacitor bank 200 includes n hold-up capacitors: C1, C2, . . . , Cn, which are electrically coupled in parallel with power and ground terminals of the data storage device 100. The number of capacitors and/or capacitance values of the capacitors may be determined based on characteristics of the data storage device (e.g., the number of flash memories, drive capacity, controller design, host write algorithm, indirection table management, performance requirements, various flash translation layer (FTL) algorithms) and/or the amount of power backup necessary for the data storage device 100.

While the data storage device 100 is connected to a power source (e.g., host 104 or some other external power source), the hold-up capacitors are charged. When the data storage device 100 is powered down (e.g., unplugged from host 104 or otherwise removed from an external power source), the hold-up capacitors discharge for an amount of time that is intended to be long enough for the data storage device 100 to safely power itself down. This amount of time may be referred to as scram time and is dependent on the number of hold-up capacitors and the capacitance values of the hold-up capacitors in the hold-up capacitor bank 200.

During the scram time, the data storage device 100 safely powers itself down by quickly performing scram operations while the hold-up capacitors still have enough charge to provide adequate power to the data storage device 100. Scram operations refer to the processing that takes place when power is removed from the data storage device 100. Power-down conditions can arise due to a variety of reasons, such as inadvertent power failure, user operation to remove the data storage device 100 from its external power source, or user operation to deactivate the data storage device 100. A relatively small amount of standby power may be provided by the hold-up capacitor bank 200 to enable the data storage device 100 to continue to operate during the shutdown scram operations. As part of the shutdown process, it is generally necessary to complete any data write operations that are in process, as well as to flush any cached write-back data from the write cache 110 to the flash memories 103. This can cause difficulties if a large amount of processing is required to complete the data transfers.

Data storage devices 100 have a limited number of hold up energy after power loss that is tied to the number of hold-up capacitors. An increase in the number of capacitors allows data storage devices 100 to stay alive longer after power loss. On the other hand, limiting the amount of data that can be written after power loss can restrict the data storage performance, since data write requests will need to be denied until previously open write requests have completed. Thus, one goal of the present disclosure is to maximize the amount of data that can be safely written given the number of hold-up capacitors that remain functional after one or more hold-up capacitors fail.

In some implementations, firmware running on the data storage device 100 may check the health of the capacitor bank 200 at regular intervals. The frequency of health checks may be tuned. However, if these health checks are carried out too frequently, an excessive amount of processing bandwidth may be needed. This may in turn impact the throughput of the data storage device 100.

In some implementations, the data storage device 100 may include hold-up capacitor health checking and isolation circuitry as described in, for example, FIGS. 2B, 2C, and 3 and corresponding disclosure in U.S. patent application Ser. No. 17/852,103, filed Jun. 28, 2022, which is hereby incorporated by reference in its entirety. Additionally or alternatively, any other capacitor health checking schemes may be implemented in order to determine the health of the hold-up capacitors in capacitor bank 200. Example capacitor health checking schemes may include periodic health checks, which may include a recharge test (e.g., if a capacitor discharges and/or recharges too quickly, it may be a failed capacitor).

Upon detecting a failed hold-up capacitor, rather than immediately transitioning the data storage device to a read-only mode, the present disclosure describes various implementations for adapting to the new state of the capacitor bank 200 and maintaining the ability of the data storage device 100 to perform write operations at the best performance level possible without risking data loss. To that end, the data storage device 100 may determine which hold-up capacitors have failed and isolate them, thereby allowing the data storage device 100 to continue to operate using the remaining hold-up capacitors. Additional details regarding hold-up capacitor failure handling are described below with reference to FIGS. 4-8.

Figure 3B:
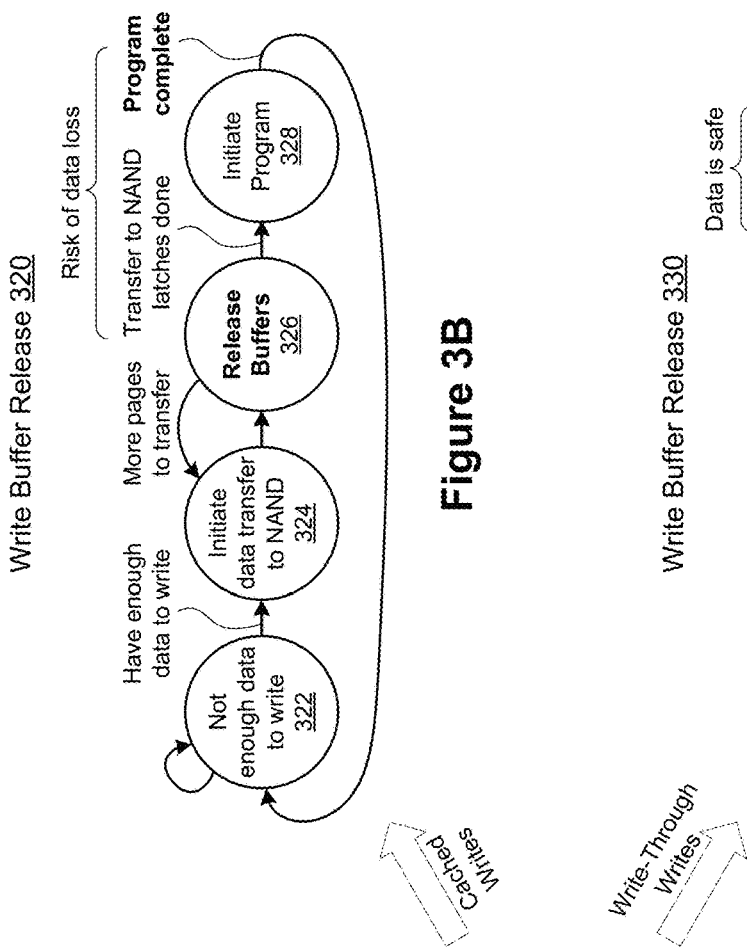
FIGS. 3A-3C are examples of state transition diagrams of allocation and release operations performed by write buffers of a write cache of a data storage device in accordance with some implementations.
Figure 3C:
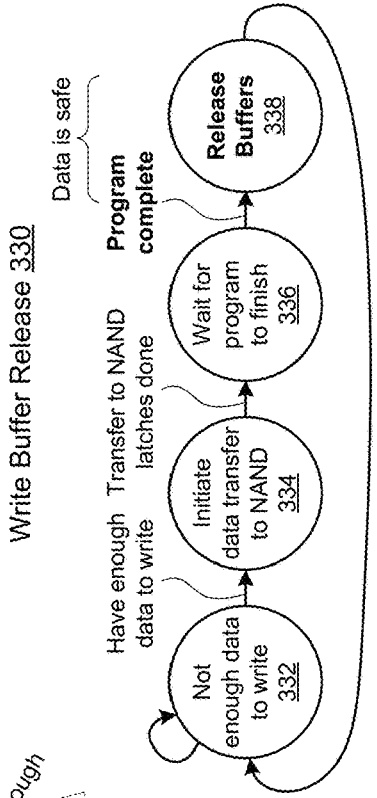
Figure 3A:
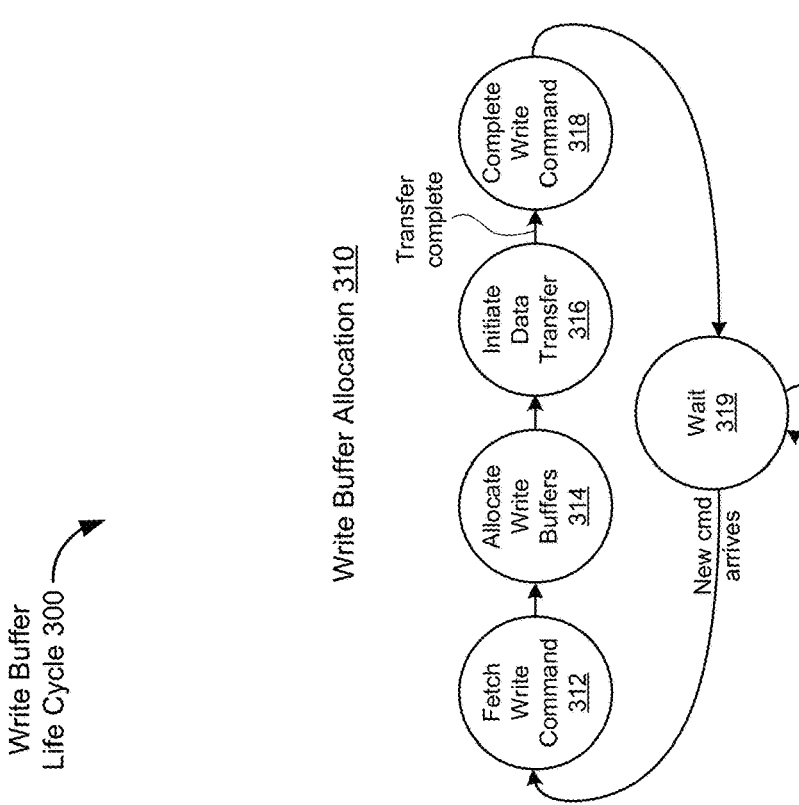

FIGS. 3A-3C are state transition diagrams of allocation and release operations performed by write buffers of a write cache 110 of a data storage device 100 in accordance with some implementations. As part of a write buffer life cycle 300, controller 101 allocates data write buffers to store data received from host 104 according to write buffer allocation scheme 310. Then, depending on the type of write operation performed on the data, controller 101 releases the write buffers so they can store new data according to write buffer release scheme 320 (for cached writes) or write buffer release scheme 330 (for write-through writes).

More specifically, in accordance with write buffer allocation scheme 310 (FIG. 3A), controller 101 fetches (312) a write command from a host submission queue, and allocates (314) write buffers of the write cache 110 to store data corresponding to the write command. Controller 101 then initiates (316) a data transfer of the data from the write cache 110 to flash memories 103. Once the data transfer is complete, controller 101 completes (318) the write command (e.g., by notifying host 104 that the data has been written) and waits (319) for a subsequent write command to arrive, at which time the process repeats with another write command fetch (312).

If the data is to be written using a cached write process (which may sometimes be referred to as a write-back process or a write-behind process), the write buffers are released according to write buffer release scheme 320 (FIG. 3B). The cached write process is a high performance, power-fail susceptible write scheme, in that the data buffer is released before the data itself has been safely written to non-volatile NAND arrays 108 in respective flash memories 103. The early release of the write buffers allows for increased throughput, but at the same time increases the chances of data loss if scram operations cannot finish (e.g., due to a hold-up capacitor failure).

More specifically, controller 101 waits (322) until there is enough data to transfer to flash memories 103 (referred to as NAND in FIG. 3B). Once there is enough data to write (e.g., a page of data, a superblock, and so forth), controller 101 transfers (324) the data to flash memories 103 and immediately releases (326) the write buffers. At this point in time, the data is located in volatile memory (data registers 106) in the respective flash memories 103 and has not yet been written to non-volatile memory (NAND arrays 108) in the respective flash memories 103. At the same time, the non-volatile write buffers that transferred the data to the flash memories 103 have been released to accept new data.

Therefore, the data transferred while in state 324 is currently in volatile memory and may be lost if the data storage device 100 powers down before the data can be written to the non-volatile NAND arrays 108. Thus, even though the cached write process benefits from efficiency (due to the write buffers being released earlier), the cached write process comes with a cost of potential data loss. When the data transfer to volatile memory (e.g., latches in registers 106) of the flash memories 103 is complete, controller 101 and/or controller 107 initiate (328) a program operation that is internal to the flash memory 103 (referred to as an inflight write or an inflight program), which causes the data to be written from the volatile registers 106 to the non-volatile NAND arrays 108.

The aforementioned cached write operations may sometimes be referred to as write-back operations, write-behind operations, or inflight write operations. A controller performing write operations in accordance with a write-back scheme first writes the data to the write cache 110 and then sends the data to the flash memories 103 once the data has been written to the write cache 110. Caching in this manner leads to low latency for write operations. But in the event of a cache failure (e.g., due to a power-down event of the data storage device 100), cached data can potentially be lost if the data is not written to non-volatile memory in the flash memories 103 as discussed above.

If the data is to be written using a write-through write process, the write buffers are released according to buffer release scheme 330 (FIG. 3C). The write-through write process is a non-power-fail susceptible write scheme, in that the data buffers are not released until the data itself has been safely written to non-volatile NAND arrays 108 in respective flash memories 103. More specifically, controller 101 waits (332) until there is enough data to transfer to flash memories 103 (referred to as NAND in FIG. 3C). Once there is enough data to write (e.g., a page of data, a superblock, and so forth), controller 101 transfers (334) the data to flash memories 103 and waits (336) for the program operation to be complete (e.g., waits for the data to be safely written to the non-volatile NAND arrays 108). At this point in time, the data is still located in the non-volatile write buffers of write cache 110. Therefore, the data will not be lost if the data storage device 100 powers down before the data can be written to the non-volatile NAND arrays 108. While the write-through write scheme has no power loss-related risk of data loss, this scheme is relatively less efficient because the write buffers cannot accept new data while the controller 101 waits (336) for the program operations to be completed. When the data transfer to volatile memory (e.g., latches in registers 106) of the flash memories 103 is complete, controller 107 notifies controller 101, which then releases (338) the write buffers to receive new data.

A controller performing a write operation in accordance with a write-through scheme writes the data to the write cache 110 and the flash memories 103 before releasing write buffers in the write cache 110 to accept new data. Caching in this manner is safer in the event of a cache failure (e.g., due to a power-down event of the data storage device 100) because the data always exists in non-volatile memory throughout the entire write operation. But this write scheme has higher latency due to the delay in release of the write buffers. Even so, a data storage device 100 writing data according to the write-through scheme has a higher write performance than a data storage device 100 operating in a read-only mode that does not allow any write operations to take place.

The hold-up capacitor failure handling schemes described in the present disclosure use different combinations of the buffer release schemes 320 and 330 described above, as described in more detail below with reference to FIGS. 4-8.

Figure 4:
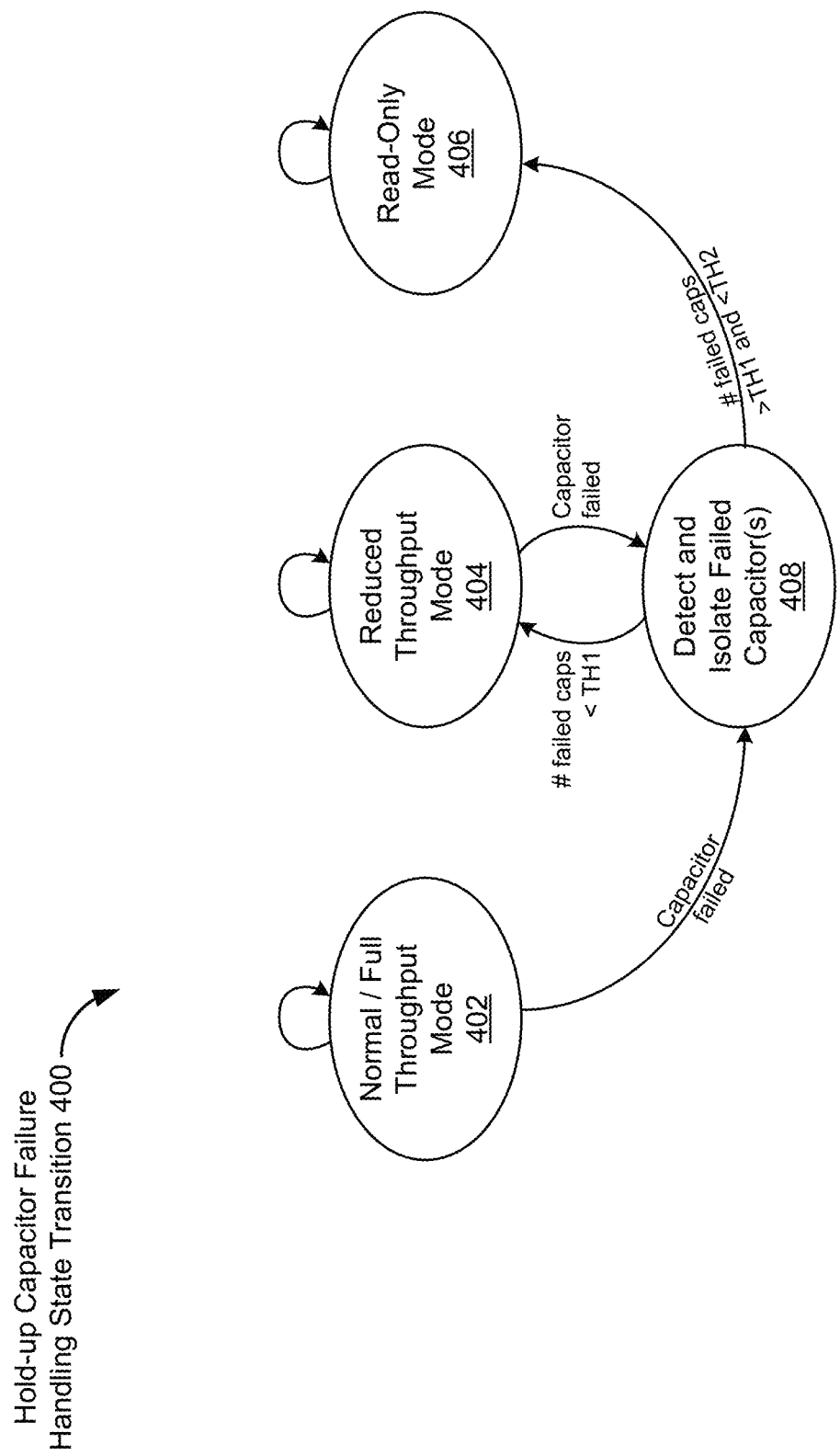
FIG. 4 is an example state transition diagram of a hold-up capacitor failure handling scheme of a data storage device in accordance with some implementations.

FIG. 4 is a state transition diagram of a hold-up capacitor failure handling scheme 400 of a data storage device 100 in accordance with some implementations. A data storage device 100 employing scheme 400 begins operating in a normal mode (which may be referred to as a full performance mode) 402. While operating in normal mode 402, there have been no hold-up capacitor failure detections yet, and the write cache 110 is operating in a manner that is optimized for maximizing performance. That is, the controller 101 performs cached writes using all of the write buffers in the write cache 110, and as a result, the controller 101 operates all of the write buffers according to the write buffer release scheme 320 (FIG. 3B). As discussed above, this mode (in which all write buffers are released according to scheme 320) is the most efficient but also the most adverse to power-failure events, because all hold-up capacitors of the hold-up capacitor bank 200 are required to ensure reliable data transfer to non-volatile memory at the time of a power-down event.

While operating in normal mode 402, if the controller 101 detects a hold-up capacitor failure, the data storage device 100 enters a state 408 during which the controller 101 detects which hold-up capacitors have failed and isolates them as described above. During this state, the controller 101 counts the total number of failed hold-up capacitors, and if the number is below a first threshold TH1 (or less than or equal to a first threshold TH1) (e.g., less than or equal to 2), the data storage device 100 transitions to a reduced throughput mode 404. Otherwise, the data storage device 100 remains in normal mode 402. While operating in reduced throughput mode 404, the write cache 110 is operating in a manner that allows cached writes to continue for subsequently received data to be written, albeit at a reduced rate in order to account for the decreased scram power capacity (due to the failed hold-up capacitor(s)). More details regarding the various schemes for implementing reduced throughput modes are described below with reference to FIGS. 5 and 6.

While operating in normal mode 402 or reduced throughput mode 404, if the controller 101 detects another hold-up capacitor failure, the data storage device 100 once again enters state 408 during which the controller 101 detects which hold-up capacitors have failed and isolates them as described above. During this state, the controller 101 counts the total number of failed hold-up capacitors, and if the number is between the first threshold TH1 and a second threshold TH2 (e.g., greater than TH1 and less than or equal to TH2, or greater than or equal to TH1 and less than TH2, or greater than TH1 and less than TH2) (e.g., greater than 2 and less than 6), the data storage device 100 transitions to a read-only mode 406. Otherwise, the data storage device 100 remains in reduced throughput mode 404. While operating in read-only mode 406, data storage device 100 is restricted from writing any new data to the flash memories 103. This is because there would not be enough scram energy left to dependably complete all write operations (due to the failed hold-up capacitors), and data would most likely be lost at the time of a power-down event.

Figure 5:
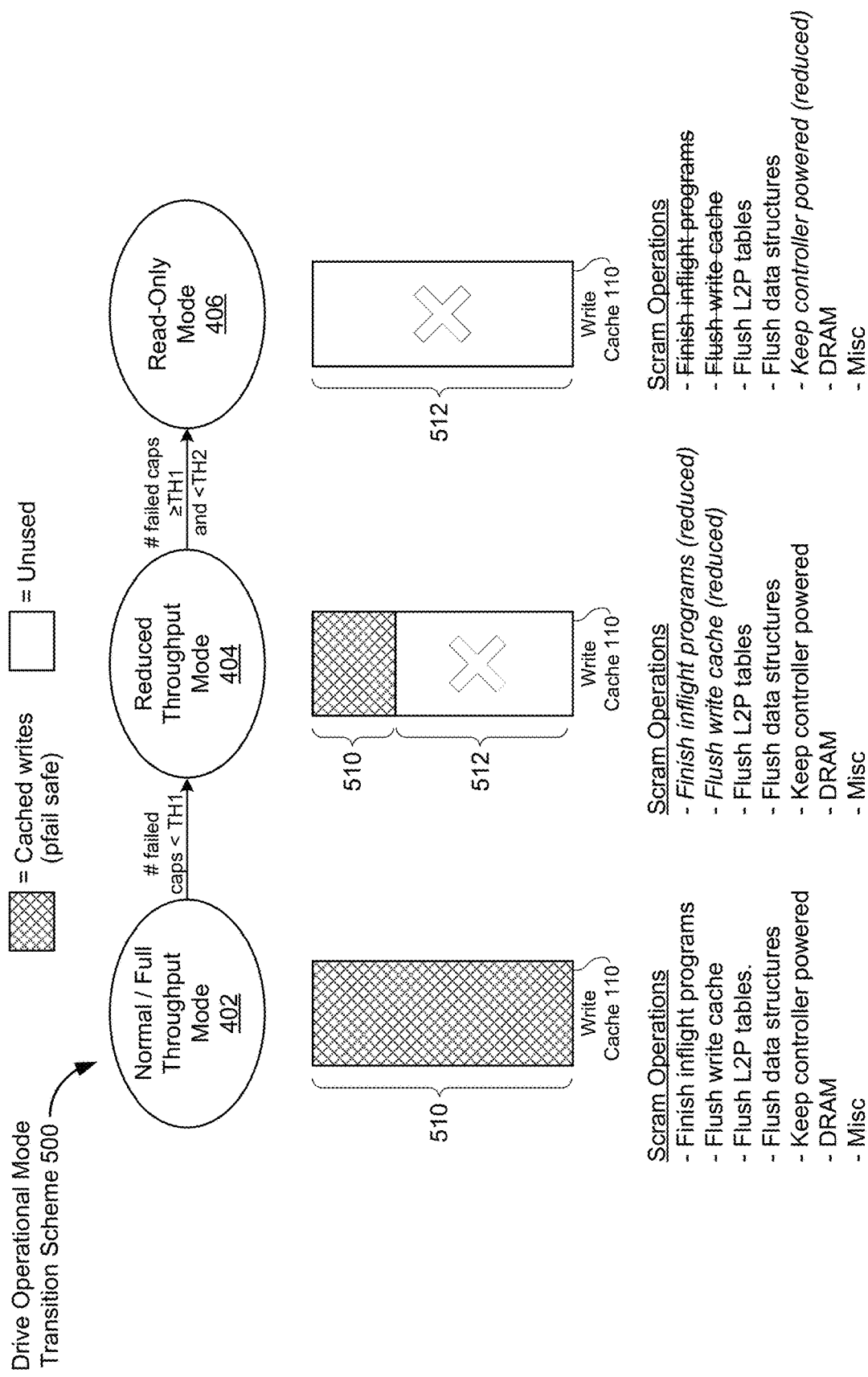
FIG. 5 is an example of a drive operational mode transition scheme showing write cache reallocations including a reduction in size of the write cache in accordance with some implementations.

FIG. 5 is a drive operational mode transition scheme 500 showing write cache reallocations including a reduction in size of the write cache 110 in accordance with some implementations. In scheme 500, the reduced throughput mode 404 is achieved by decreasing the size of the write cache 110.

Specifically, while in normal mode 402, all of the write buffers in the write cache 110 are operating according to the efficient buffer release scheme 320 (corresponding to cached writes). Stated another way, the entire buffer pool of the write cache 110 is configured to be operating according to allocation scheme 310 and release scheme 320.

While operating in normal mode 402, at the time of a power-down event (labeled in the figure as a power failure, or pfail), the controller 101 performs scram operations, which begin with finishing all inflight programs (all of the cached write operations currently using the write buffers in write cache 110). Upon finishing all of the inflight programs, the controller 101 flushes the write cache 110, flushes L2P tables, flushes data structures, and keeps itself powered for long enough to perform these and other housekeeping operations (e.g., involving dynamic random access memory (DRAM) and other volatile components of data storage device 100).

While operating in normal mode 402, if fewer than a first threshold TH1 of failed hold-up capacitors are detected (e.g., if only 1 or 2 failed hold-up capacitors are detected), data storage device 100 transitions to the reduced throughput mode 404, which includes controller 101 reducing the size of the write cache 110. Stated another way, controller 101 reallocates the write cache 110, or reallocates write buffers in the write cache 110, so that there are fewer write buffers available for performing cached write operations (e.g., the write buffers in portion 510). The reset of the write buffers (e.g., those in portion 512) may be repurposed for other data storage tasks of the data storage device 100. The size of portion 510 of the write cache 110 may be based on the number of detected failed hold-up capacitors. For example, if only one failed hold-up capacitor is detected, portion 510 in reduced throughput mode 404 may be half the size of portion 510 in normal mode 402, while if two failed hold-up capacitors are detected, portion 510 in reduced throughput mode may be one quarter the size of portion 510 in normal mode 402. The specific relationship between increases in failed hold-up capacitor count and decreases in write cache size may depend on specific design requirements of the data storage device 100.

While operating in reduced throughput mode 404, at the time of a power-down event, the controller 101 performs scram operations as described above, with at least two notable differences. First, since the size of the buffer pool of the write cache 110 is decreased, there are fewer inflight programs to be completed, and the amount of write buffers of the write cache 110 that need to be flushed is decreased. Thus, less scram energy is needed to complete scram operations in reduced throughput mode 404, thereby performing in a manner consistent with fewer hold-up capacitors being available to supply scram energy during the shutdown period.

While operating in reduced throughput mode 404, if a number between the first threshold TH1 and a second threshold TH2 of failed hold-up capacitors is detected (e.g., if only more than 2 and less than 7 failed hold-up capacitors are detected), data storage device 100 transitions to read-only mode 406, which includes controller 101 reducing the size of the write cache 110 to zero. As such, all of the write buffers in portion 512 of the buffer pool of write cache 110 in reduced throughput mode 404 are unavailable for performing write operations, and the data storage device 100 ceases accepting write commands and performing write operations.

While operating in read-only mode 406, at the time of a power-down event, the controller 101 performs scram operations as described above, with at least two notable differences. First, since the size of the buffer pool of the write cache 110 is now zero, there are no inflight programs to finish, and no write cache to flush. Thus, even less scram energy is needed to complete scram operations in read-only mode 406, thereby performing in a manner consistent with even fewer hold-up capacitors being available to supply scram energy during the shutdown period.

Figure 6:
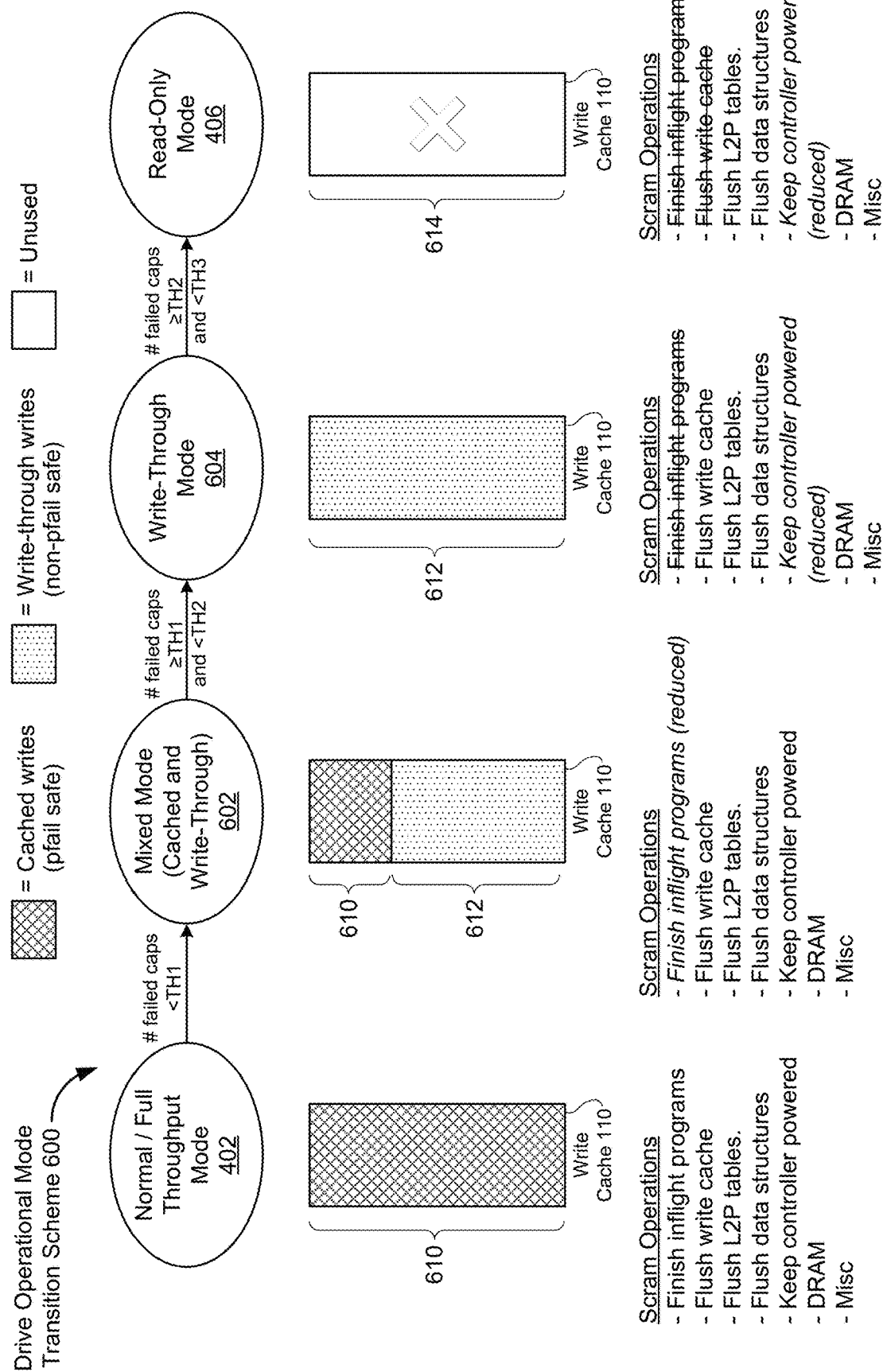
FIG. 6 is an example of a drive operational mode transition scheme showing write cache reallocations including reallocations of portions of the write cache that perform cached writes and write-through writes in accordance with some implementations.

FIG. 6 is a drive operational mode transition scheme 600 showing write cache reallocations including reallocations of portions of the write cache 110 that perform cached writes and write-through writes in accordance with some implementations. In scheme 600, full mode 402 and read-only mode are the same as described above (with the possible exception of differences in threshold TH values), but instead of a single reduced throughput mode 404, scheme 600 includes two reduced throughput modes—a mixed mode 602 and a write-through mode 604. In scheme 600, rather than reducing the size of the write cache 110, the size of the write cache 110 remains the same while (i) the portion 610 of the write cache 110 that is used for performing efficient but scram power-hungry cached writes is decreased (e.g., fewer write buffers are made available for cached writes), and (ii) the portion 612 of the write cache 110 that is used for performing less efficient but scram power-neutral write-through writes is increased (e.g., more write buffers are made available for write-through writes).

Specifically, while operating in normal mode 402, the data storage device 100 and corresponding scram operations function as described above with reference to normal mode 402 in FIG. 5. If fewer than TH1 failed hold-up capacitors are detected (e.g., 1 or 2), the data storage device 100 transitions to a mixed mode 602, in which the write cache 110 is reallocated into two portions—a first portion 610 associated with cached writes (operating according to buffer release scheme 320), and a second portion 620 associated with write-through writes (operating according to buffer release scheme 330). While operating in mixed mode 602, at the time of a power-down event, the controller 101 performs scram operations as described above with reference to normal mode 402, with the exception of a reduction in inflight programs that need to be finished (since portion 610 is smaller in mixed mode 602 than it is in normal mode 402). Thus, less scram energy is required.

Importantly, while operating in mixed mode 602, at the time of a power-down event, all of the write-through operations using write buffers in portion 612 may be stopped immediately (can be aborted mid-write) to conserve scram power, because these write buffers have not yet been released. As such, these write operations may be aborted mid-write and restarted upon power-up (when power is reapplied to the data storage device 100), since the data is still in these write buffers. However, the cached write operations using write buffers in portion 610 cannot be aborted since the data in these write buffers have already been replaced with new data from the host 104. As such, controller 101 must use scram energy to finish the cached write operations using the buffers in portion 610 of the write cache 110.

Stated another way, at the time of a power-down event, data in portion 610 of the write cache 110 has not been written to NAND arrays 108 yet, but will be able to complete writing by using scram energy, while data in portion 612 of the write cache 112 is still safe in the write buffers and those writes can be re-attempted at the next power-up event. Thus, all data being written at the time of a power-down event is (or will shortly be) safe.

The size of portion 610 (with respect to the total size of the write cache 110) and the size of portion 612 (with respect to the total size of the write cache 110) may be determined based on the count of failed hold-up capacitors. For example, as the count increases, portion 610 may decrease, which causes portion 612 to increase. As the size of portion 610 continues to decrease, portion 610 eventually disappears, leaving the entire write cache 110 characterized by portion 612, causing the data storage device 100 to operate in the write-through mode 604.

While operating in normal mode 402 or mixed mode 602, if TH1 to TH2 failed hold-up capacitors are detected (e.g., 3 or 4), the data storage device 100 transitions to write-through mode 604, in which the write cache 110 is reallocated into a single portion 612 associated with write-through writes (operating according to buffer release scheme 330). In other words, the entire write cache 110 (all of the write buffers in the write cache) is configured to only perform write-through write operations. While operating in write-through mode 604, at the time of a power-down event, the controller 101 performs scram operations as described above with reference to normal mode 402, with the exception being no requirement to complete any inflight programs, since the data is already safely stored in the non-volatile write cache 110. Thus, the controller 101 does not require as much power to perform scram operations.

While operating in normal mode 402, mixed mode 602, or write-through mode 604, if TH2 to TH3 failed hold-up capacitors are detected (e.g., 5 or 6), the data storage device 100 transitions to read-only mode 406, which corresponds to read-only mode 406 as described above in FIG. 5. While operating in read-only mode 406, data storage device 100 is restricted from writing any new data to the flash memories 103. This is because there would not be enough scram energy left to dependably complete all write operations (due to the failed hold-up capacitors), and data would most likely be lost at the time of a power-down event. While operating in read-only mode 406, at the time of a power-down event, the controller 101 performs scram operations as described above with reference to normal mode 402, with at least two notable differences. First, since the size of the buffer pool of the write cache 110 (portion 614) is now zero, there are no inflight programs to finish, and no write cache to flush. Thus, even less scram energy is needed to complete scram operations in read-only mode 406, thereby performing in a manner consistent with even fewer hold-up capacitors being available to supply scram energy during the shutdown period.

In some implementations, the data storage device 100 may operate in a reduced throughput mode that combines features of modes 404, 602, and 606. For example, while the write cache 110 is split into two portions 610 and 612 as in mode 602, the size of the write cache 110 may also be decreased as in mode 404. Likewise, while the size of the write cache 110 is decreased as in mode 404, the remaining write buffers of the write cache 110 may be split into two portions 610 and 612 as in mode 602. Further, while in mode 604, the size of the write cache 110 may be decreased. Likewise, while in mode 404, the write buffers may operate only using write-through operations as in mode 604. In each of the aforementioned combination of features, as the count of failed hold-up capacitors increases, the size of the write cache 110 may decrease, the proportion of the reduced write cache 110 that is used for cached writes (as in portion 610) may decrease, and the proportion of the reduced write cache 110 that is used for write-through writes (as in portion 612) may increase.

FIG. 7 is a flowchart of a hold-up capacitor failure handling method 700 in accordance with some implementations. Method 700 may be governed by instructions that are stored in a non-transitory computer-readable storage medium (e.g., storage medium 102). The instructions may be included in one or more programs stored in the non-transitory computer readable storage medium. When executed by one or more processors (e.g., controller 101), the instructions cause the data storage device 100 to perform the method. The instructions may include source code, assembly language code, object code, or any other instruction format that can be interpreted by one or more processors. Some operations in the process may be combined, and the order of some operations may be changed.

The data storage device 100 performs method 700 every time there is a detected hold-up capacitor failure. While performing (702) memory operations at a normal throughput level (normal mode 402), controller 101 detects (704) a hold-up capacitor failure. In some implementations, this includes receiving a capacitor failure notification from capacitor health checking circuitry as described above. In response to the detection, controller 101 notifies host 104 of the detected failure and performs (706) one or more quiesce operations (e.g., while in state 408). These quiesce operations include one or more of: ceasing the fetching of commands from the submission queue, ceasing the fetching of new host command processing, finishing inflight host write/read transfer requests, flushing the write cache 110 (including writing the data in the write cache to an open superblock), persisting FTL metadata (L2P table, etc., similar to scram operations), optionally aborting commands that are sitting in the submission queue to avoid command timeouts, and optionally aborting commands that are fetched from an administrative command queue but not yet started. These quiesce commands may be referred to as housekeeping or cleanup operations, and are quickly performed in order to keep data intact (minimize the possibility losing data) if a power loss were to occur soon after detecting the failed hold-up capacitor(s).

Upon completing the quiesce operations, controller 101 determines (708) a count of failed hold-up capacitors. This count includes the hold-up capacitor failure(s) that caused the notification in detection operation 704 as well as all other failed hold-up capacitors (a total count of failed hold-up capacitors). In some implementations, this operation includes probing the capacitor bank 200 for failed capacitors (e.g., by discharging and charging each capacitor to determine if any are discharging and/or charging too quickly or not at all), and isolating the failed hold-up capacitors so that the data storage device 100 may continue to operate without the failed hold-up capacitors reducing the amount of scram energy that may be provided by hold-up capacitors that are still healthy.

In some implementations, upon completing the probing and isolating of the failed hold-up capacitors, controller 101 may also notify the host 104 that the data storage device 100 has finished probing and isolating the failed hold-up capacitors.

In some implementations, upon completing the probing and isolating of the failed hold-up capacitors, controller 101 may update a healthy capacitor bit-map in an internal file system stored in storage medium 102. This allows the controller 101 to remember which capacitors are faulty so that the controller 101 can continue to turn them off each time the data storage device 100 is powered on.

The controller 101 proceeds to reallocate (710) the write cache 110 based on the count of failed hold-up capacitors. In some implementations, a static mapping in the firmware (stored in storage medium 102) provides reallocation configuration (e.g., sizes of portions 510, 512, 610, and 612) for each possible count of failed hold-up capacitors, and controller 101 consults this static mapping in order to determine how to reallocate the write cache 110.

In some implementations, the controller 101 proceeds to determine (712) whether, after the reallocation, the size of the write cache would still be greater than 0 (in other words, whether there would still be a portion 510, 610, or 612). If so, controller 101 continues operating (714) in a reduced-throughput mode corresponding with the determined reallocation (e.g., in mode 404, 602, or 604). If not, controller 101 continues operating (716) in a read-only mode (e.g., in mode 406).

Figure 8B:
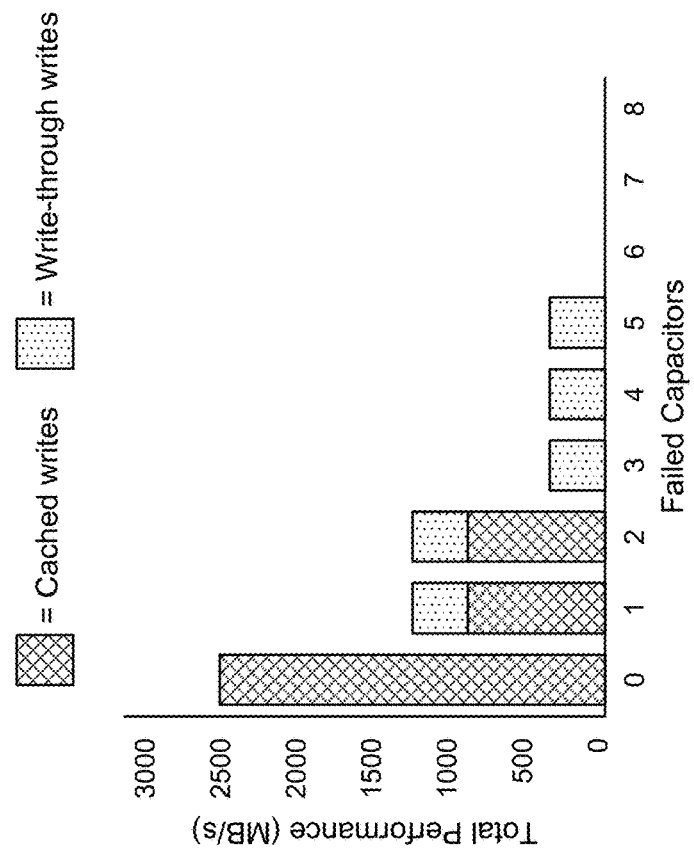
FIGS. 8A-8B are graphs showing example benefits of the hold-up capacitor failure handling schemes described herein, in accordance with some implementations.
Figure 8A:
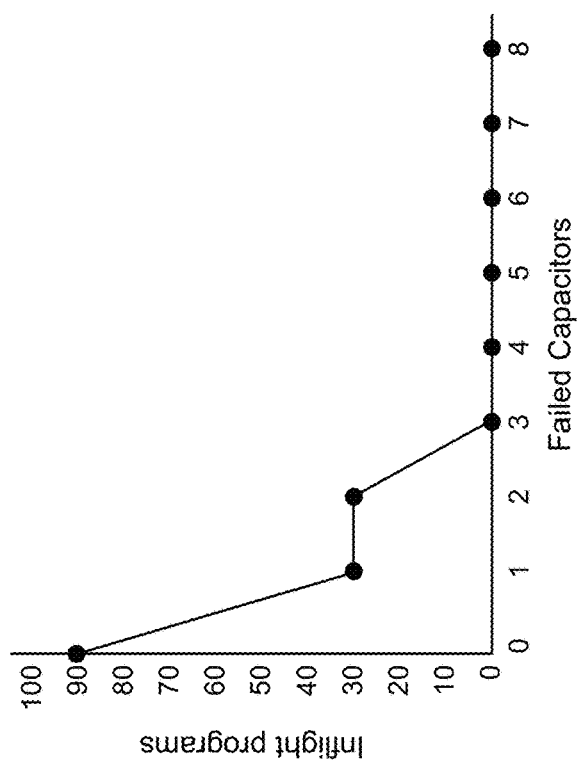

FIGS. 8A-8B are graphs showing example benefits of the hold-up capacitor failure handling schemes described herein, in accordance with some implementations.

Referring to FIG. 8A, in contrast to some conventional data storage devices that no longer allow inflight program operations after having detected just one failed hold-up capacitor, the hold-up capacitor failure handling schemes as described in the present disclosure may continue to allow inflight program operations after having detect one or more (e.g., 1 or 2) failed hold-up capacitors (e.g., consistent with any of reduced throughput modes 404, 602, and 604), before tapering down to no longer allowing inflight program operations after detecting, for example, three failed hold-up capacitors (e.g., consistent with read-only mode 406).

Referring to FIG. 8B, in contrast to some conventional data storage devices that no restrict write performance to 0 MB/s after having detected just one failed hold-up capacitor, the hold-up capacitor failure handling schemes as described in the present disclosure may continue to support write operations (albeit with reduced performance) up to various threshold counts of failed hold-up capacitors. For example, a data storage device 100 having one or two failed hold-up capacitors as described in the present disclosure may continue to have a total write performance of 800 MB/s in mode 404 or 1200 MB/s in mode 602, while a data storage device 100 having between three and five hold-up capacitors as described in the present disclosure may continue to have a total write performance of 300 MB/s in mode 604. While these performance numbers are reduced from the peak performance of 2500 MB/s when all hold-up capacitors are healthy, they are still much higher than 0 MB/s of write performance exhibited by some conventional data storage systems upon detecting one or more failed hold-up capacitors.

Thus, the hold-up capacitor failure handling schemes described in the present application make data storage devices more tolerant to a higher number of failed hold-up capacitors, reducing the reliance of data storage devices on hold-up capacitor energy in the event of a power loss, thereby increasing performance and the total usable life of a data storage device.

Various example embodiments and aspects of the disclosure are described below for convenience. These are provided as examples, and do not limit the subject technology. Some of the examples described below are illustrated with respect to the figures disclosed herein simply for illustration purposes without limiting the scope of the subject technology.

One or more aspects of the subject technology provide a data storage device 100, comprising: a non-volatile flash memory (e.g., 103) configured to store data; a controller (e.g., 101) configured to control the non-volatile memory and communicate with a host (e.g., 104); a write cache (e.g., 110) including write buffers configured to pass data from the host (e.g., 104) to the non-volatile flash memory (e.g., 103) during write operations; and a plurality of hold-up capacitors (e.g., 200) configured to provide back-up power for at least the non-volatile memory, the controller, and the write cache. The controller (e.g., 101) is configured to: detect one or more failed hold-up capacitors of the plurality of hold-up capacitors (e.g., 704); and in response to detecting the one or more failed hold-up capacitors: perform one or more quiesce operations (e.g., 706); determine a first count of the one or more failed hold-up capacitors (e.g., 708); and based on the first count of the one or more failed hold-up capacitors, reallocate the write buffers of the write cache for use in one or more subsequent write operations (e.g., transition to mode 404, 406, 602, or 604).

In some implementations, the controller is configured to reallocate the write buffers of the write cache by reducing a size of the write cache for use in the one or more subsequent write operations (e.g., transitioning to mode 404). The controller may be configured to reduce the size of the write cache by an amount based on the first count of the one or more failed hold-up capacitors (e.g., the higher the count, the greater the reduction in size).

In some implementations, the controller is configured to reallocate the write buffers of the write cache by allocating a first portion (e.g., 510) of the write buffers of the write cache for use in the one or more subsequent write operations; and preventing a second portion (e.g., 512) of the write buffers of the write cache from being used in the one or more subsequent write operations.

In some implementations, the controller is configured to reallocate the write buffers of the write cache based on a determination that the first count of the one or more failed hold-up capacitors is below a threshold (e.g., less than TH1); and subsequent to performing the one or more subsequent write operations, the controller is further configured to detect additional one or more failed hold-up capacitors of the plurality of hold-up capacitors (e.g., 704); and in response to detecting the additional one or more failed hold-up capacitors: perform one or more quiesce operations (e.g., 706); determine that a second count of failed hold-up capacitors meets the threshold (e.g., is greater than TH1); and based on the determination that the second count of failed hold-up capacitors meets the threshold, transition the non-volatile memory to a read-only mode (e.g., 406).

In some implementations, the controller is configured to reallocate the write buffers of the write cache based on a determination that the first count of the one or more failed hold-up capacitors is below a first threshold (less than TH1); the controller is configured to reallocate the write buffers of the write cache by: allocating a first portion (e.g., 610) of the write cache for performing cached write operations; and allocating a second portion (e.g., 612) of the write cache for performing write-through operations; and the controller is further configured to: perform a first plurality of cached write operations using one or more buffers in the first portion (e.g., 610) of the write cache; and perform a first plurality of write-through operations using one or more buffers in the second portion (e.g., 612) of the write cache.

In some implementations, the controller is configured to: allocate the first portion (e.g., 610) of the write cache by setting a size of the first portion (e.g., 610) based on the first count of the one or more failed hold-up capacitors; and allocate the second portion (e.g., 612) of the write cache by setting a size of the second portion that is equal to the total write cache (e.g., the size of write cache 110 in FIG. 6) minus the size of the first portion 610 of the write cache. In some implementations, the total write cache may represent the size of all of the write buffers in the write cache (e.g., 110). The size of the first portion (e.g., 610) of the write cache may represent the size of all of the write buffers in the first portion (e.g., 610) of the write cache (e.g., 110). The size of the second portion (e.g., 612) of the write cache may represent the size of all of the write buffers in the second portion (e.g., 612) of the write cache (e.g., 110).

In some implementations, the controller is further configured to: while performing the first plurality of cached write operations and the first plurality of write-through operations (e.g., in mode 602), detect a first power-down event of the data storage device; and in response to detecting the first power-down event of the data storage device, perform a first plurality of scram operations (e.g., in mode 602) while the plurality of hold-up capacitors are providing power to the data storage device, wherein the first plurality of scram operations include: completing the first plurality of cached write operations before powering down the data storage device; and ceasing one or more write operations of the first plurality of write-through operations before the one or more write operations of the first plurality of write-through operations are complete.

In some implementations, subsequent to performing the first plurality of cached write operations and the first plurality of write-through operations (e.g., in mode 602), the controller is further configured to: detect additional one or more failed hold-up capacitors of the plurality of hold-up capacitors (e.g., 704); and in response to detecting the additional one or more failed hold-up capacitors: perform one or more quiesce operations (e.g., 706); determine that a second count of failed hold-up capacitors meets the first threshold and is below a second threshold (is between TH1 and TH2 in FIG. 6); based on the determination that the second count of failed hold-up capacitors meets the first threshold and is below the second threshold, reallocate all of the write cache for performing write-through operations (e.g., portion 612 in mode 604); and subsequent to allocating all of the write cache for performing write-through operations, perform a second plurality of write-through operations using one or more write buffers in the write cache. In some implementations, all of the write cache may represent all of the write buffers in the write cache (e.g., 110).

In some implementations, the controller is further configured to: while performing the second plurality of write-through operations (e.g., in mode 604), detect a second power-down event of the data storage device; and in response to detecting the second power-down event of the data storage device, perform a second plurality of scram operations (e.g., in mode 604) while the plurality of hold-up capacitors are providing power to the data storage device, wherein the second plurality of scram operations include: ceasing one or more write operations of the second plurality of write-through operations before the one or more write operations of the second plurality of write-through operations are complete.

In some implementations, subsequent to performing the second plurality of write-through operations, the controller is further configured to: detect second additional one or more failed hold-up capacitors of the plurality of hold-up capacitors (e.g., 704); and in response to detecting the second additional one or more failed hold-up capacitors: perform one or more quiesce operations (e.g., 706); determine that a third count of failed hold-up capacitors meets the second threshold (is greater than or equal to TH2); and based on the determination that the third count of failed hold-up capacitors meets the second threshold, transition the non-volatile memory to a read-only mode (e.g., mode 406).

In some implementations, the controller is configured to reallocate the write buffers of the write cache based on a determination that the first count of the one or more failed hold-up capacitors meets a first threshold (e.g., is greater than or equal to TH1); the controller is configured to reallocate the write buffers of the write cache by allocating all of the write cache for performing write-through operations (e.g., mode 604); and subsequent to allocating all of the write cache for performing write-through operations, the controller is configured to perform a plurality of write-through operations using one or more buffers in the write cache (e.g., in portion 612).

In some implementations, the one or more quiesce operations include one or more of the following: finishing one or more inflight programs; flushing the write cache; flushing one or more logical-to-physical tables; and flushing one or more data structures.

In some implementations, the controller is further configured to, in response to detecting the one or more failed hold-up capacitors, cause the one or more failed hold-up capacitors to be isolated.

In other aspects, a method is implemented using one or more controllers for one or more storage devices. The method may include the operations described above with reference to the data storage device (e.g., 100), the controller (e.g., 101), the write cache (e.g., 110), the hold-up capacitors (e.g., 200), and modes (e.g., 402-408 and 602-604).

In further aspects, a system may include: means for performing the operations described above with reference to the data storage device (e.g., 100), the controller (e.g., 101), the write cache (e.g., 110), the hold-up capacitors (e.g., 200), and modes (e.g., 402-408 and 602-604).

In one or more aspects, a method includes one or more methods, operations or portions thereof described herein. In one or more aspects, an apparatus includes one or more memories and one or more processors, the one or more processors configured to cause performing one or more methods, operations or portions thereof described herein. In one or more aspects, an apparatus includes means adapted for performing one or more methods, operations or portions thereof described herein. In one or more aspects, a hardware apparatus includes circuits configured to perform one or more methods, operations or portions thereof described herein. In one or more aspects, an apparatus includes components operable to carry out one or more methods, operations or portions thereof described herein. In one or more aspects, a non-transitory machine-readable storage medium (e.g., one or more memories and/or one or more registers) store instructions that, when executed by one or more processors, cause one or more processors to perform one or more methods, operations or portions thereof described herein.

Further examples of the subject technology include various subsets of the above examples combined or otherwise re-arranged in various forms.

In some examples, to illustrate the interchangeability of hardware and software, items such as the various illustrative blocks, modules, components, methods, operations, instructions, and algorithms may have been described generally in terms of their functionality. In some examples, whether such functionality is implemented as hardware, software or a combination of hardware and software depends upon the particular application and design constraints imposed on the overall system. Skilled artisans may implement the described functionality in varying ways for each particular application.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" may refer to only A, only B, or only C; any combination of A, B, and C; and/or at least one of each of A, B, and C.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the terms "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order, with the exception of steps and/or operations necessarily occurring in a particular order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

In one or more examples, when an element is "connected" or "coupled" to another element, the element can be directly connected or coupled to another element, and can be indirectly connected or coupled to another element with one or more intervening elements disposed or interposed between the elements, unless otherwise specified.

The disclosure is provided to enable any person skilled in the art to practice the various aspects described herein. In some instances, when a detailed description of well-known functions or configurations may unnecessarily obscure aspects of the present disclosure, the detailed description thereof may be omitted. The disclosure provides various examples of the subject technology, and the subject technology is not limited to these examples. Various modifications to these aspects will be readily apparent to those skilled in the art, and the principles described herein may be applied to other aspects.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

The shapes, sizes, areas, ratios, numbers, and the like disclosed in the drawings for describing implementations of the present disclosure are merely examples, and thus, the present disclosure is not limited to the illustrated details.

When the term "comprise," "have," "include," "contain," "constitute," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. An element proceeded by "a," "an," "the," or "said" does not, without further constraints, preclude the existence of additional elements.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, or the like). Furthermore, while the subject disclosure may provide many example ranges and values, these are non-limiting examples, and other ranges and values are within the scope of the subject technology.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The description provided in the background section should not be assumed to be prior art merely because it is mentioned in or associated with the background section. The background section may include information that describes one or more aspects of the subject technology, and the description in this section does not limit the invention.

In addition to the description provided in the summary section, other systems, methods, features and advantages will be, or will become, apparent to one with skill in the art upon examination of the present disclosure. It is intended that all such additional systems, methods, features and advantages be within the scope of the present disclosure, and be protected by the following claims. Nothing in the summary section should be taken as a limitation on those claims. Further aspects and advantages are also discussed herein.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A data storage device, comprising:
    a non-volatile memory configured to store data;
    a controller configured to control the non-volatile memory and communicate with a host;
    a write cache including write buffers configured to pass data from the host to the non-volatile memory during write operations; and
    a plurality of hold-up capacitors configured to provide back-up power for at least the non-volatile memory, the controller, and the write cache,
    wherein the controller is configured to:
        detect one or more failed hold-up capacitors of the plurality of hold-up capacitors; and
        in response to detecting the one or more failed hold-up capacitors:
            perform one or more quiesce operations;
            determine a first count of the one or more failed hold-up capacitors; and
            based on the first count of the one or more failed hold-up capacitors, reallocate the write buffers of the write cache for use in one or more subsequent write operations.

2. The data storage device of claim 1, wherein the controller is configured to reallocate the write buffers of the write cache by reducing a size of the write cache for use in the one or more subsequent write operations.

3. The data storage device of claim 2, wherein the controller is configured to reduce the size of the write cache by an amount based on the first count of the one or more failed hold-up capacitors.

4. The data storage device of claim 1, wherein the controller is configured to reallocate the write buffers of the write cache by:
    allocating a first portion of the write buffers of the write cache for use in the one or more subsequent write operations; and
    preventing a second portion of the write buffers of the write cache from being used in the one or more subsequent write operations.

5. The data storage device of claim 4, wherein:
the controller is configured to reallocate the write buffers of the write cache based on a determination that the first count of the one or more failed hold-up capacitors is below a threshold; and
subsequent to performing the one or more subsequent write operations, the controller is further configured to:
detect additional one or more failed hold-up capacitors of the plurality of hold-up capacitors; and
in response to detecting the additional one or more failed hold-up capacitors:
perform one or more quiesce operations;
determine that a second count of failed hold-up capacitors meets the threshold; and
based on the determination that the second count of failed hold-up capacitors meets the threshold, transition the non-volatile memory to a read-only mode.

6. The data storage device of claim 1, wherein:
the controller is configured to reallocate the write buffers of the write cache based on a determination that the first count of the one or more failed hold-up capacitors is below a first threshold;
the controller is configured to reallocate the write buffers of the write cache by:
allocating a first portion of the write cache for performing cached write operations; and
allocating a second portion of the write cache for performing write-through operations; and
the controller is further configured to:
perform a first plurality of cached write operations using one or more buffers in the first portion of the write cache; and
perform a first plurality of write-through operations using one or more buffers in the second portion of the write cache.

7. The data storage device of claim 6, wherein the controller is configured to:
allocate the first portion of the write cache by setting a size of the first portion based on the first count of the one or more failed hold-up capacitors; and
allocate the second portion of the write cache by setting a size of the second portion that is equal to a total size of the write cache minus the size of the first portion of the write cache.

8. The data storage device of claim 6, wherein the controller is further configured to:
while performing the first plurality of cached write operations and the first plurality of write-through operations, detect a first power-down event of the data storage device; and
in response to detecting the first power-down event of the data storage device, perform a first plurality of scram operations while the plurality of hold-up capacitors are providing power to the data storage device, wherein the first plurality of scram operations include:
completing the first plurality of cached write operations before powering down the data storage device; and
ceasing one or more write operations of the first plurality of write-through operations before the one or more write operations of the first plurality of write-through operations are complete.

9. The data storage device of claim 6, wherein:
subsequent to performing the first plurality of cached write operations and the first plurality of write-through operations, the controller is further configured to:
detect additional one or more failed hold-up capacitors of the plurality of hold-up capacitors; and
in response to detecting the additional one or more failed hold-up capacitors:
perform one or more quiesce operations;
determine that a second count of failed hold-up capacitors meets the first threshold and is below a second threshold;
based on the determination that the second count of failed hold-up capacitors meets the first threshold and is below the second threshold, reallocate all of the write cache for performing write-through operations; and
subsequent to allocating all of the write cache for performing write-through operations, perform a second plurality of write-through operations using one or more write buffers in the write cache.

10. The data storage device of claim 9, wherein the controller is further configured to:
while performing the second plurality of write-through operations, detect a second power-down event of the data storage device; and
in response to detecting the second power-down event of the data storage device, perform a second plurality of scram operations while the plurality of hold-up capacitors are providing power to the data storage device, wherein the second plurality of scram operations include:
ceasing one or more write operations of the second plurality of write-through operations before the one or more write operations of the second plurality of write-through operations are complete.

11. The data storage device of claim 9, wherein:
subsequent to performing the second plurality of write-through operations, the controller is further configured to:
detect second additional one or more failed hold-up capacitors of the plurality of hold-up capacitors; and
in response to detecting the second additional one or more failed hold-up capacitors:
perform one or more quiesce operations;
determine that a third count of failed hold-up capacitors meets the second threshold; and
based on the determination that the third count of failed hold-up capacitors meets the second threshold, transition the non-volatile memory to a read-only mode.

12. The data storage device of claim 1, wherein:
the controller is configured to reallocate the write buffers of the write cache based on a determination that the first count of the one or more failed hold-up capacitors meets a first threshold;
the controller is configured to reallocate the write buffers of the write cache by allocating all of the write cache for performing write-through operations; and
subsequent to allocating all of the write cache for performing write-through operations, the controller is configured to perform a plurality of write-through operations using one or more buffers in the write cache.

13. The data storage device of claim 1, wherein the one or more quiesce operations include one or more of the following:
finishing one or more inflight programs;
flushing the write cache;
flushing one or more logical-to-physical tables; and
flushing one or more data structures.

14. The data storage device of claim 1, wherein the controller is further configured to, in response to detecting the one or more failed hold-up capacitors, cause the one or more failed hold-up capacitors to be isolated.

15. A method of operating a data storage device, the method comprising:
at a data storage device including a non-volatile memory configured to store data, a controller configured to control the non-volatile memory and communicate with a host, a write cache including write buffers configured to pass data from the host to the non-volatile memory during write operations, and a plurality of hold-up capacitors configured to provide back-up power for at least the non-volatile memory, the controller, and the write cache:
detecting one or more failed hold-up capacitors of the plurality of hold-up capacitors; and
in response to detecting the one or more failed hold-up capacitors:
performing one or more quiesce operations;
determining a first count of the one or more failed hold-up capacitors; and
based on the first count of the one or more failed hold-up capacitors, reallocating the write buffers of the write cache for use in one or more subsequent write operations.

16. The method of claim 15, wherein reallocating the write buffers of the write cache includes:
allocating a first portion of the write buffers of the write cache for use in the one or more subsequent write operations; and
preventing a second portion of the write buffers of the write cache from being used in the one or more subsequent write operations.

17. The method of claim 15, wherein:
reallocating the write buffers of the write cache includes:
basing the reallocating of the write buffers of the write cache on a determination that the first count of the one or more failed hold-up capacitors is below a first threshold;
allocating a first portion of the write cache for performing cached write operations; and
allocating a second portion of the write cache for performing write-through operations; and
the method further comprises:
performing a first plurality of cached write operations using one or more buffers in the first portion of the write cache; and
performing a first plurality of write-through operations using one or more buffers in the second portion of the write cache.

18. The method of claim 17, further comprising:
while performing the first plurality of cached write operations and the first plurality of write-through operations, detecting a first power-down event of the data storage device; and
in response to detecting the first power-down event of the data storage device, performing a first plurality of scram operations while the plurality of hold-up capacitors are providing power to the data storage device, wherein the first plurality of scram operations include:
completing the first plurality of cached write operations before powering down the data storage device; and
ceasing one or more write operations of the first plurality of write-through operations before the one or more write operations of the first plurality of write-through operations are complete.

19. The method of claim 17, further comprising:
subsequent to performing the first plurality of cached write operations and the first plurality of write-through operations:
detecting additional one or more failed hold-up capacitors of the plurality of hold-up capacitors; and
in response to detecting the additional one or more failed hold-up capacitors:
performing one or more quiesce operations;
determining that a second count of failed hold-up capacitors meets the first threshold and is below a second threshold; and
based on the determination that the second count of failed hold-up capacitors meets the first threshold and is below the second threshold, reallocating all of the write cache for performing write-through operations; and
subsequent to allocating all of the write cache for performing write-through operations, performing a second plurality of write-through operations using one or more write buffers in the write cache.

20. A data storage device, comprising:
a non-volatile memory configured to store data;
a controller configured to control the non-volatile memory and communicate with a host;
a write cache including write buffers configured to pass data from the host to the non-volatile memory during write operations; and
a plurality of hold-up capacitors configured to provide back-up power for at least the non-volatile memory, the controller, and the write cache,
wherein the controller includes:
means for detecting one or more failed hold-up capacitors of the plurality of hold-up capacitors; and
means for performing one or more quiesce operations in response to detecting the one or more failed hold-up capacitors;
means for determining a first count of the one or more failed hold-up capacitors in response to detecting the one or more failed hold-up capacitors; and
means for reallocating reallocate the write buffers of the write cache for use in one or more subsequent write operations based on the first count of the one or more failed hold-up capacitors.

* * * * *